(12) United States Patent
Maruyama

(10) Patent No.: US 10,192,731 B2
(45) Date of Patent: Jan. 29, 2019

(54) LIQUID PROCESSING METHOD, SUBSTRATE PROCESSING APPARATUS, AND STORAGE MEDIUM

(71) Applicant: Tokyo Electron Limited, Tokyo (JP)

(72) Inventor: Hirotaka Maruyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 15/446,071

(22) Filed: Mar. 1, 2017

(65) Prior Publication Data

US 2017/0256392 A1 Sep. 7, 2017

(30) Foreign Application Priority Data

Mar. 4, 2016 (JP) ................................. 2016-042521

(51) Int. Cl.
*H01L 21/02* (2006.01)
*H01L 21/67* (2006.01)
*H01L 21/687* (2006.01)

(52) U.S. Cl.
CPC .. *H01L 21/02052* (2013.01); *H01L 21/02057* (2013.01); *H01L 21/67028* (2013.01); *H01L 21/67051* (2013.01); *H01L 21/67253* (2013.01); *H01L 21/68764* (2013.01)

(58) Field of Classification Search
None
See application file for complete search history.

(56) References Cited

U.S. PATENT DOCUMENTS

| 8,216,389 | B2 * | 7/2012 | Yoshihara | B08B 3/024 134/18 |
| 2002/0059943 | A1 * | 5/2002 | Inagaki | B08B 3/08 134/18 |
| 2013/0032091 | A1 * | 2/2013 | Yokogawa | C23C 16/4407 118/712 |

FOREIGN PATENT DOCUMENTS

| JP | 2007-036180 A | 2/2007 |
| JP | 2007-263485 A | 10/2007 |

* cited by examiner

*Primary Examiner* — Eric W Golightly
(74) *Attorney, Agent, or Firm* — Abelman, Frayne & Schwab

(57) ABSTRACT

In drying a substrate disposed inside a processing container after performing a liquid processing on the substrate, a low humidity gas for lowering a humidity inside the processing container is supplied during a time period when a processing liquid is supplied to the center portion of the substrate, and the processing liquid supplied to the center portion of the substrate is stopped after a humidity measurement value obtained by measuring the humidity inside the processing container becomes equal to or less than a preset humidity target value.

12 Claims, 11 Drawing Sheets

LIQUID PROCESSING METHOD, SUBSTRATE PROCESSING APPARATUS, AND STORAGE MEDIUM

CROSS-REFERENCE TO RELATED APPLICATIONS

This application is based on and claims priority from Japanese Patent Application No. 2016-042521, filed on Mar. 4, 2016, with the Japan Patent Office, the disclosure of which is incorporated herein in its entirety by reference.

TECHNICAL FIELD

The present disclosure relates to a technology of drying a substrate processed with a processing liquid.

BACKGROUND

A technology has been known which performs a liquid processing on a substrate by sequentially switching and supplying, for example, a chemical liquid and a rinsing liquid to a surface of a rotating substrate (e.g., a semiconductor wafer (referred to as a "wafer")). When the liquid processing is completed, drying the substrate is performed by supplying a highly volatile drying liquid such as, for example, isopropyl alcohol (IPA) to the rotating substrate to replace the liquid remaining on the surface of the substrate with the drying liquid, and then, discharging the drying liquid (see, e.g., Japanese Laid-Open Patent Publication No. 2007-36180: Claim 4, paragraph 0087, and FIG. 3).

Meanwhile, when the humidity inside the processing container where the liquid processing is performed is high, a dew condensation may occur on the dried surface of the wafer. When a droplet attached to the surface of the wafer at the time of the occurrence of the dew condensation is dried at a later time, a watermark may be formed thereby contaminating the liquid-processed wafer, or a pattern on the surface of the wafer may, for example, collapse due to an action of the surface tension caused from the droplet.

SUMMARY

The present disclosure relates to a liquid processing method for performing a liquid processing on a substrate disposed inside a processing container, and then, drying the substrate. The liquid processing method includes: a processing liquid supplying process of performing a liquid processing by supplying a processing liquid to a center portion of the substrate inside the processing container; a low humidity gas supplying process of supplying a low humidity gas for lowering a humidity inside the processing container, into the processing container during a time period when the processing liquid is supplied to the substrate; and a drying process of removing the processing liquid on the substrate and drying the substrate. The drying process is started after a humidity measurement value obtained by measuring the humidity inside the processing container becomes equal to or less than a preset humidity target value.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
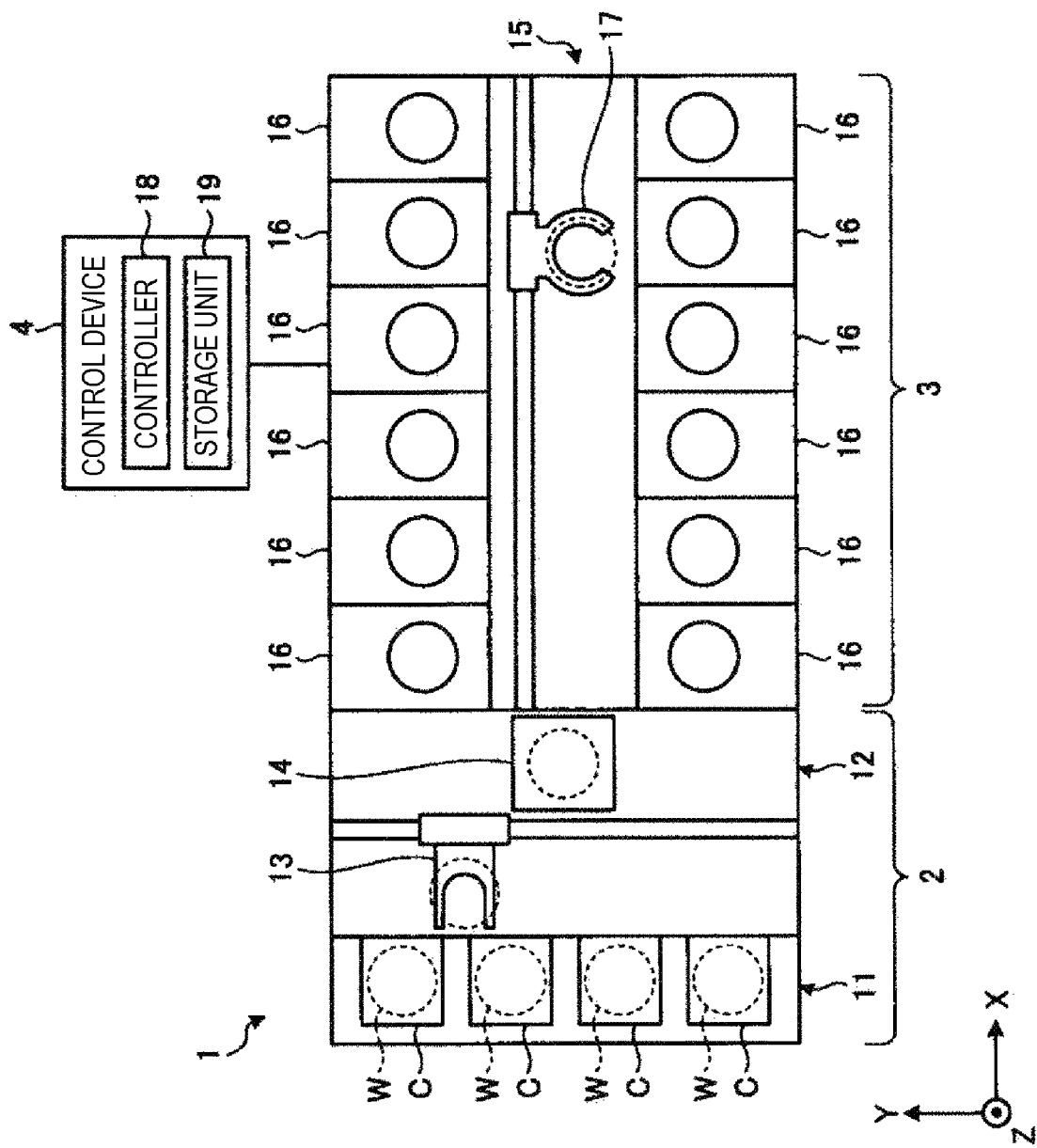
FIG. 1 is a plan view illustrating an outline of a substrate processing system provided with a processing unit according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here. The illustrative embodiments described in the detailed description, drawing, and claims are not meant to be limiting. Other embodiments may be utilized, and other changes may be made without departing from the spirit or scope of the subject matter presented here.

The present disclosure has been made in consideration of the foregoing, and an object of the present disclosure is to provide a liquid processing method in which, by performing a management of the humidity inside a processing container, drying a substrate may be performed while suppressing a collapse of a pattern on the surface of the substrate, a substrate processing apparatus, and a storage medium storing the method.

The present disclosure provides a liquid processing method for performing a liquid processing on a substrate disposed inside a processing container, and then, drying the substrate. The liquid processing method includes: a processing liquid supplying process of performing a liquid processing by supplying a processing liquid to a center portion of the substrate inside the processing container; a low humidity gas supplying process of supplying a low humidity gas for lowering a humidity inside the processing container, into the processing container during a time period when the processing liquid is supplied to the substrate; and a drying process of removing the processing liquid on the substrate and drying the substrate. The drying process is started after a humidity measurement value obtained by measuring the humidity inside the processing container becomes equal to or less than a preset humidity target value.

The above-described liquid processing method may include the following configuration.

In the above-described liquid processing method, the drying process is started by stopping the supply of the processing liquid to the center portion of the substrate.

In the above-described liquid processing method, a switching timing of the processing liquid supplying process and the drying process is preset, and the processing liquid supplying process is switched to the drying process when the humidity measurement value becomes equal to or less than the preset humidity target value at the switching timing.

In the above-described liquid processing method, a switching timing of the processing liquid supplying process and the drying process is preset, the processing liquid supplying process is not switched to the drying process when the humidity measurement value does not become equal to or less than the preset humidity target value at the switching timing, and the processing liquid supplying process is continued.

In the above-described liquid processing method, when the humidity measurement value becomes equal to or less than the preset humidity target value after the processing liquid supplying process is continued, the processing liquid supplying process is switched to the drying process.

In the above-described liquid processing method, when the humidity measurement value does not become equal to or less than the preset humidity target value after a preset time lapses from the time when the processing liquid supplying process is continued, the processing liquid supplying process is switched to the drying process, and an alarm is generated to a device performing the liquid processing.

In the above-described liquid processing method, when the humidity measurement value becomes equal to or less than the preset humidity target value during the processing liquid supplying process, the processing liquid supplying process is switched to the drying process.

In the above-described liquid processing method, a switching timing of the processing liquid supplying process and the drying process is preset, and the processing liquid supplying process is switched to the drying process when the humidity measurement value becomes equal to or less than the preset humidity target value during the processing liquid supplying process which precedes the switching timing.

In the above-described liquid processing method, a timing for starting a supply of the low humidity gas in the low humidity gas supplying process is set by determining, in advance, an estimated time from the start of the supply of the low humidity gas to the processing container until a target value reaching timing obtained by estimating when the humidity measurement value becomes equal to or less than the humidity target value, and counting the estimated time backward from the target value reaching timing, and the target value reaching timing is set to precede the switching timing.

In the above-described liquid processing method, a timing for starting a supply of the low humidity gas in the low humidity gas supplying process is set by determining, in advance, an estimated time from the start of the supply of the low humidity gas to the processing container until a target value reaching timing obtained by estimating when the humidity measurement value becomes equal to or less than the humidity target value, and counting the estimated time backward from the target value reaching timing, and the target value reaching timing is set to precede the switching timing.

In the above-described liquid processing method, the supply of the processing liquid is performed on the substrate held horizontally and rotating around a vertical axis, and a measurement of the humidity inside the processing container is performed at a position radially outside the rotating substrate.

The present disclosure provides a substrate processing apparatus including: a substrate holding unit that is disposed inside a processing container to hold a substrate; a rotation driving unit that rotates the substrate holding unit; a processing liquid supply unit that supplies a processing liquid to the substrate held on the substrate holding unit; a low humidity gas supply unit that supplies a low humidity gas having a lower humidity than an atmosphere, into the processing container; a humidity measurement unit that measures a humidity inside the processing container; and a controller that controls an operation of the processing liquid supply unit. The controller rotates the substrate by rotating the rotation driving unit, supplies the processing liquid to a center portion of the rotating substrate, and stops the supply of the processing liquid to the center portion of the substrate while continuously rotating the substrate after a humidity measurement value obtained by measuring the humidity inside the processing container by the humidity measurement unit becomes equal to or less than a preset humidity target value.

In the above-described substrate processing apparatus, the substrate holding unit is configured to hold the substrate horizontally and be rotatable around the vertical axis, and the humidity measurement unit is disposed at a position radially outside the substrate rotating while being held on the substrate holding unit.

The present disclosure provides a non-transitory computer readable storage medium storing a computer program used in a substrate processing apparatus which performs a liquid processing on a substrate. In the computer program, a step group is organized to execute the above-described liquid processing method.

In the present disclosure, drying a substrate may be performed while suppressing a collapse of a pattern on the surface of the substrate, by performing a management of the humidity inside the processing container.

FIG. 1 is a view schematically illustrating a configuration of a substrate processing system according to an exemplary embodiment of the present disclosure. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed to accommodate a plurality of substrates, i.e., semiconductor wafers (hereinafter, "wafers W") in the present exemplary embodiment, horizontally.

The transfer section 12 is provided adjacent to the carrier placing section 11 and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis. The substrate transfer device 13 transfers the wafer W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafer W between the delivery unit 14 and the processing units 16 by using the wafer holding mechanism.

Each processing unit 16 performs a predetermined substrate processing on the wafer W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The control unit 18 controls the operation of the liquid processing system 1 by reading and executing the program stored in the storage unit 19.

Further, the program may be recorded in a computer-readable recording medium, and installed in the storage unit 19 of the control device 4 from the storage medium. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes a wafer W out of a carrier C placed in the carrier placing section 11, and then, places the taken wafer W on the transfer unit 14. The wafer W placed on the transfer unit 14 is taken out of the transfer unit 14 by the substrate transfer device 17 of the processing station 3, and carried into the processing unit 16.

The wafer W carried into the processing unit 16 is processed by the processing unit 16, and then, carried out of the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
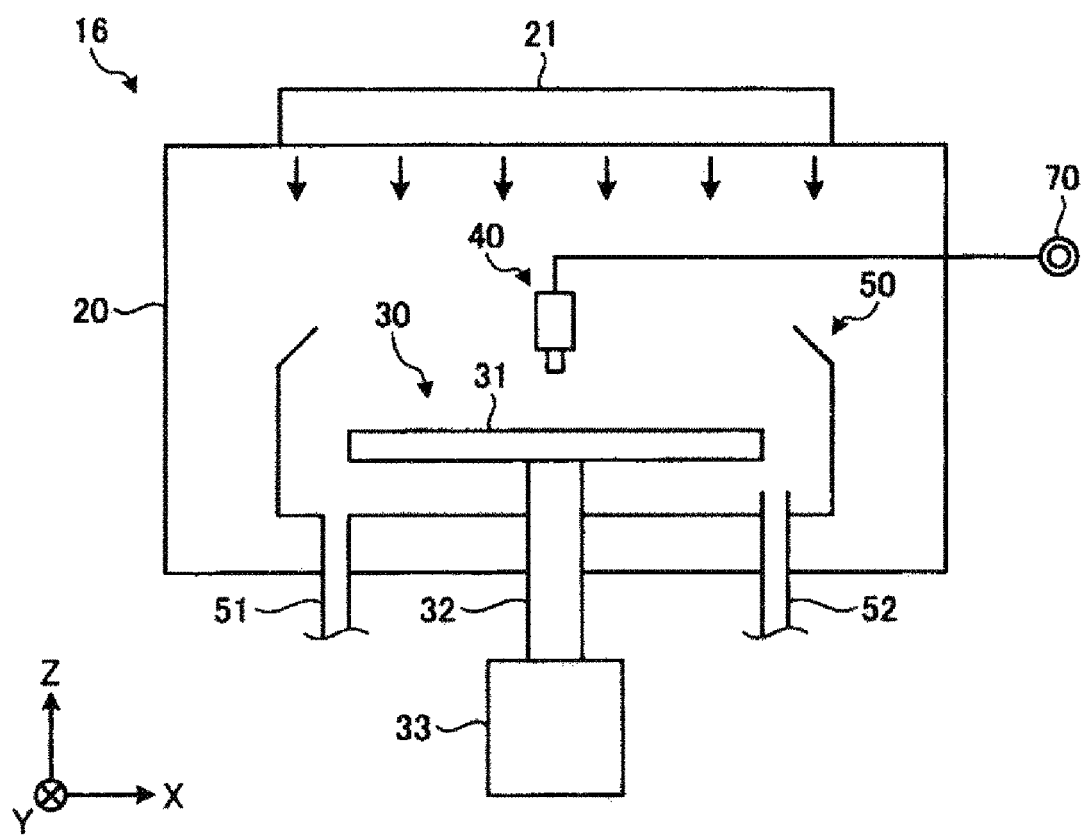
FIG. 2 is a vertical sectional side view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow within the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33 so that the holding unit 31 supported by the support unit 32 is rotated, and hence, the wafer W held on the holding unit 31 is rotated.

The processing fluid supply unit 40 supplies a processing fluid onto the wafer W. The processing fluid supply unit 40 is connected to a processing fluid supply source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

The processing unit 16 provided in the above-described substrate processing system corresponds to the substrate processing apparatus according to the present disclosure. The processing unit 16 have a configuration to supply IPA as a drying liquid to the rotating wafer W that has been subjected to the processing with a chemical liquid and a rinsing liquid, and then, dry the wafer W. The chemical liquid, the rinsing liquid, or the drying liquid corresponds to the processing liquid of the present exemplary embodiment. Hereinafter, the above-described configuration will be described with reference to FIG. 3.

As described above in relation to the processing unit 16, the processing fluid supply unit 40 includes a chemical liquid nozzle 413 that supplies a chemical liquid to the wafer W held on the substrate holding mechanism 30, a deionized water (DIW) nozzle 412 that supplies DIW as a rinsing liquid to the wafer W, and an IPA nozzle 411 that supplies IPA to the wafer W.

In the present exemplary embodiment, the above-described nozzles 411 to 413 are provided at the tip end portion of a common nozzle arm 41. The side of the base end portion of the first nozzle arm 41 is connected to a guide rail 42 to move the nozzles 411 to 413 between a position above the center portion of the wafer W held on the holding unit (a substrate holding unit) 31 and a position retreating laterally from the position above the wafer W. The guide rail 42 is provided with a driving unit 421 configured to move the first nozzle arm 41. Here, in FIG. 3, the first nozzle arm 41 that has retreated laterally is represented by a solid line, and the first nozzle arm 41 that has entered the position above the center portion of the wafer W is represented by a dashed line.

The chemical liquid nozzle 413 is connected to a chemical liquid supply source 73 via an opening/closing valve V3. One or more types of chemical liquids are supplied from the chemical liquid supply source 73 depending on a purpose of a processing of the wafer W. In the present exemplary embodiment, one type of a chemical liquid is described. The chemical liquid is supplied from the chemical liquid nozzle 413 through the opening/closing valve V3.

The DIW nozzle 412 is connected to a DIW supply source 72 via an opening/closing valve V2. DIW is supplied from the DIW nozzle 412 through the opening/closing valve V2.

The DIW nozzle 412, the opening/closing valve V2, and the DIW supply source 72 correspond to a rinsing liquid supply unit of the present exemplary embodiment.

The IPA nozzle 411 is connected to an IPA supply source 71 via an opening/closing valve V1. IPA is supplied from the IPA nozzle 411 through the opening/closing valve V1. The IPA is a drying liquid having a higher volatility than that of the processing liquid (e.g., DIW) which is being supplied to the wafer W immediately before the IPA is supplied.

The IPA nozzle 411, the opening/closing valve V1, and the IPA supply source 71 correspond to a drying liquid supply unit of the present exemplary embodiment.

Figure 3:
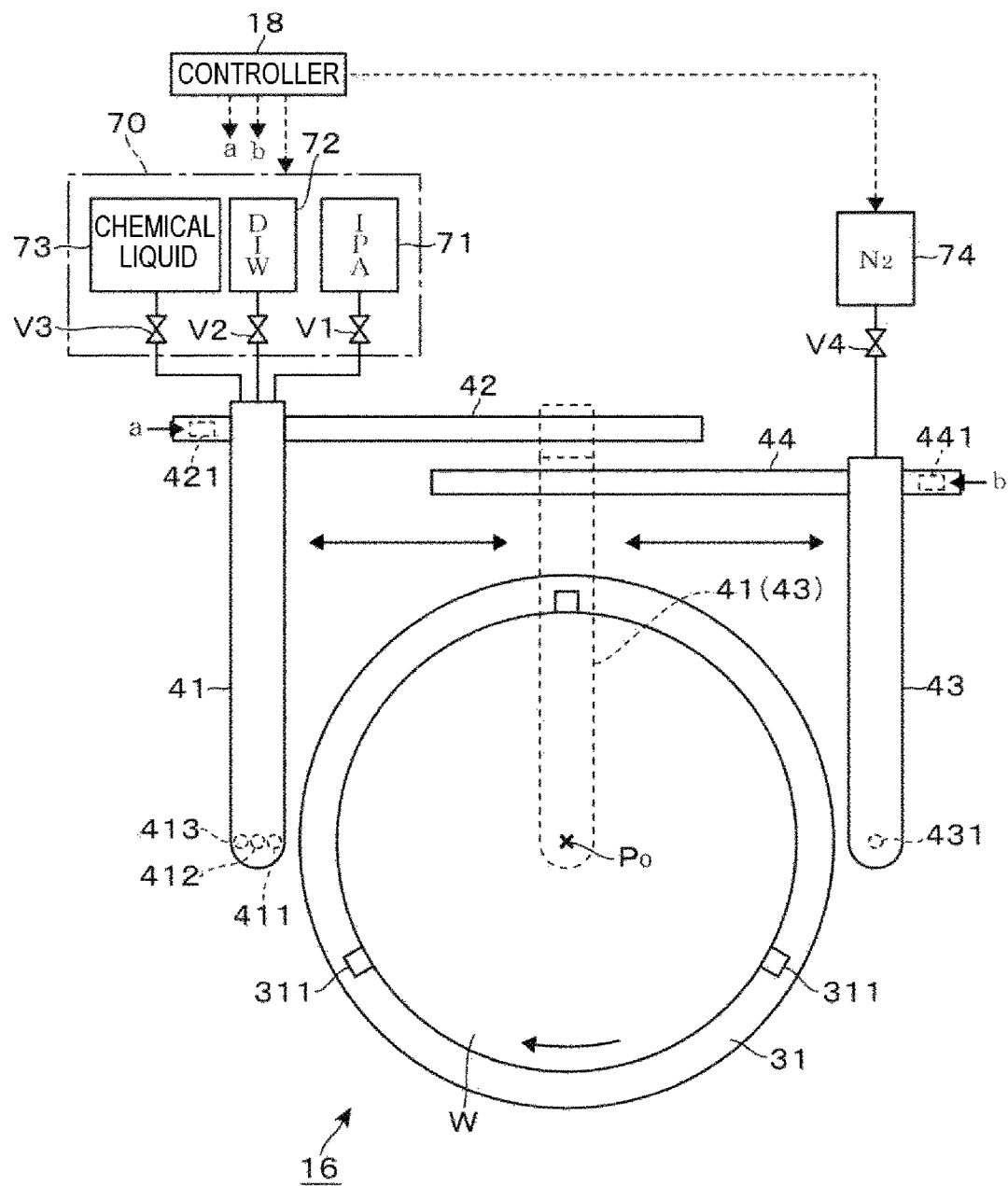
FIG. 3 is a plan view of the processing unit.

In addition, as illustrated in FIG. 3, the processing unit 16 includes a nitrogen (N2) nozzle 431 to supply N2 gas which is an inert gas as a drying gas, to the surface of the wafer W to which the drying liquid has been supplied.

In the present exemplary embodiment, the N2 nozzle 431 is provided at the tip end portion of a second nozzle arm 43 different from the above-described first nozzle arm 41 which is provided with the IPA nozzle 411 and others. The side of the base end portion of the second nozzle arm 43 is connected to a guide rail 44 to move the N2 nozzle 431 between the position above the center portion of the wafer W held on the holding unit 31 and a position retreating laterally from the position above the wafer W. The guide rail 44 is provided with a driving unit 441 configured to move the second nozzle arm 43. In FIG. 3, the second nozzle arm 43 that has retreated laterally is represented by a solid line, and the second nozzle arm 43 that has entered the position above the center portion of the wafer W is represented by a dashed line.

The N2 nozzle 431 is connected to an N2 supply source 74 via an opening/closing valve V4.

In addition, the processing unit 16 according to the present exemplary embodiment may switch and supply clean air (atmosphere) taken from the FFU 21 and clean dry air (CDA) as a low humidity gas having a lower humidity than that of the clean air, into the chamber 20 which is a processing container.

Hereinafter, a gas supply into the chamber 20 and an exhaust system will be described with reference to FIG. 4. For convenience of illustration, FIG. 4 omits the illustration of the nozzle arms 41 and 43 provided with the nozzles 411 to 413 and 431, respectively, and the driving mechanisms thereof (the guide rails 42 and 44, and the driving units 421 and 441).

Figure 4:
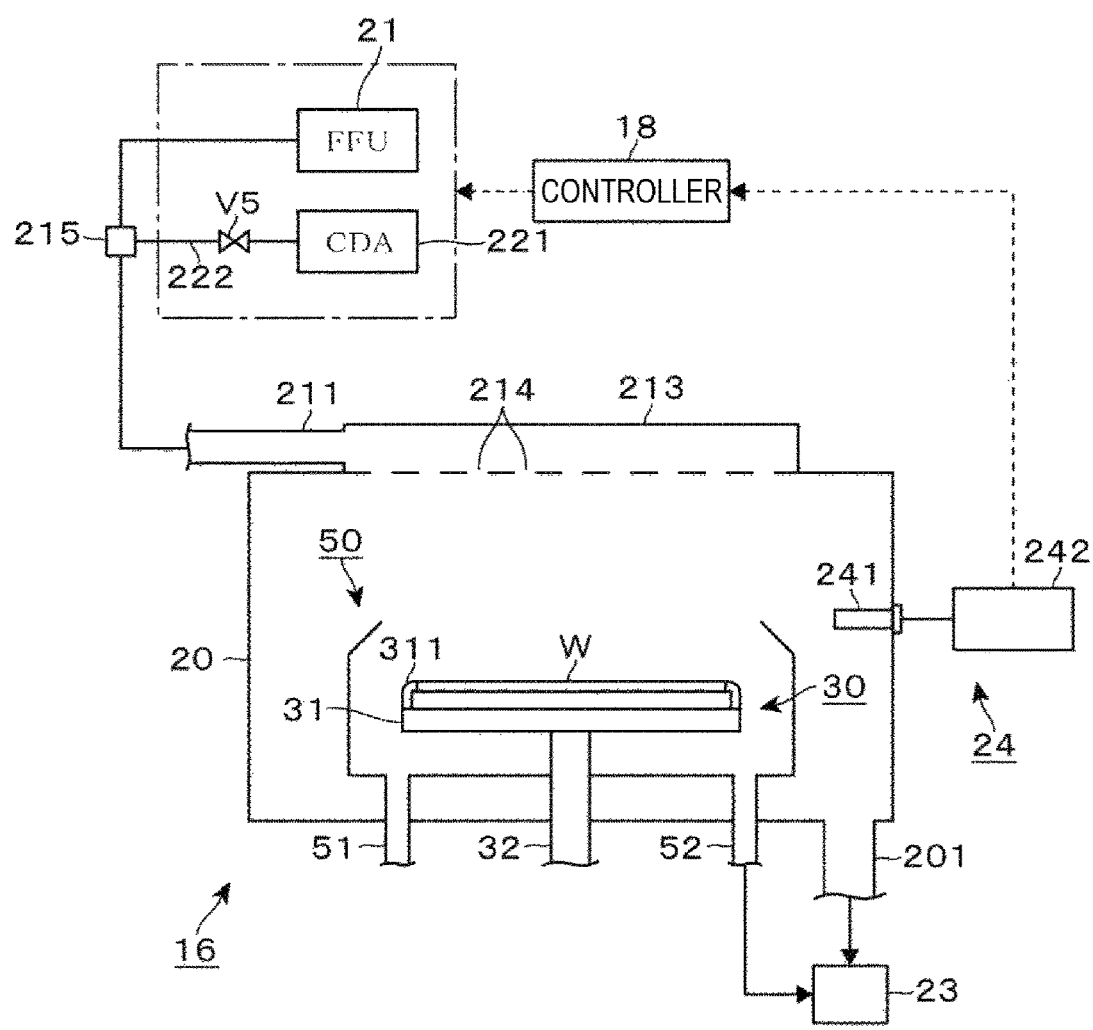
FIG. 4 is a view for explaining a supply of a gas into the processing unit and an exhaust system.

More specifically, in the processing unit 16 of the present exemplary embodiment, the FFU 21 illustrated in FIG. 2 is disposed on, for example, the ceiling of the substrate processing system 1 and configured to distribute and supply the clean air taken from the FFU 21 into the plurality of processing units 16 in the substrate processing system 1 (FIG. 4).

As illustrated in FIG. 4, each processing unit 16 is provided with a gas supply line 211 that receives the clean air distributed and supplied from the FFU 21, and a gas diffusion portion 213 that supplies the clean air received from the gas supply line 211 into the chamber 20 to form a downflow of the clean air.

The gas supply line 211 is provided between the FFU 21 and each processing unit 16.

The gas diffusion portion 213 is provided to cover the ceiling surface of the chamber 20 which constitutes the processing unit 16, and forms a space where the clean air supplied from the gas supply line 211 is diffused, above the ceiling surface. A plurality of gas supply holes 214 are provided on the entire ceiling surface of the chamber 20 covered by the gas diffusion portion 213, and the clean air is supplied into the chamber 20 through the gas supply holes 214.

In addition, the above-described gas supply line 21 and gas diffusion portion 213 may supply the CDA having a lower humidity than that of the clean air, in a switching manner with the clean air supplied from the FFU 21.

That is, as illustrated in FIG. 4, a switching valve 215 is interposed on the gas supply line 211 of each processing unit 16, and a CDA supply line 222 is connected to the switching valve 215 to perform a supply of the CDA. An opening/closing valve V5 is interposed on the CDA supply line 222, and the upstream side of the CDA supply line 222 is connected to a CDA supply source 221.

The CDA used herein is one from which water is removed by additionally performing, for example, an absorption processing or a cooling processing for clean air obtained by removing particles or impurities using, for example, an air filter.

For example, when a target value of the humidity inside the chamber 20 during a time period for supplying the CDA is set to 1 mass % (a standard state conversion value of 0° C. and 1 atm.; identically applied hereinafter) of a saturated steam amount, CDA having a lower humidity than 1% is supplied from the CDA supply source 221.

The CDA supply line 222, the CDA supply source 221, and the gas supply line 211 and the gas diffusion portion 213 at the downstream side of the conversion valve 215 during the time period for receiving the CDA, correspond to a low humidity gas supply unit of the present exemplary embodiment.

The clean air or the CDA supplied into the chamber 20 from the gas diffusion portion 213 becomes a downflow to flow down inside the chamber 20. A part of the clean air or the CDA flows into the recovery cup 50 and is exhausted toward an external exhaust unit 23 through the exhaust port 52 provided on the bottom of the recovery cup 50 as described above.

In addition, the clean air or the CDA that has not flowed into the recovery cup 50 is exhausted toward the external exhaust unit 23 through, for example, a chamber exhaust port 201 provided on the bottom of the chamber 20.

The processing unit 16 having the above-described configuration is further provided with a hygrometer 24 which is a humidity measurement unit that measures the humidity inside the chamber 20. For example, the hygrometer 24 includes a sensor 241 that performs a humidity measurement, and a body 242 that converts the humidity inside the chamber 20 which is measured by the sensor 241 into an electric signal and outputs the electric signal to the controller 18. As the hygrometer 24, any hygrometer may be used without limitation of a specific humidity measurement method as long as the hygrometer may measure the humidity inside the chamber 20. For example, a resistance change type hygrometer or an electrostatic capacitance type hygrometer may be adopted.

As illustrated in FIG. 4, the sensor 241 is inserted into the chamber 20 through, for example, the side wall of the chamber 20. Inside the chamber 20, the sensor 241 may be disposed at a position where the sensor 241 may detect whether the gas in contact with the surface of the wafer W inside the chamber 20 becomes equal to or less than the humidity target value over the entire surface of the wafer W. In view of this point, the sensor 241 is disposed outside the recovery cup 50, i.e., at a height position above the recovery cup 50 which is radially outside the substrate held on the holding unit 31.

There is a tendency that the humidity at the position outside the recovery cup 50 is higher than that at the side of the top surface of the wafer W held on the substrate holding mechanism 30 because the gas inside the chamber 20 easily stays at the position outside the recovery cup 50. Accordingly, when a humidity measurement value measured at the position outside the recovery cup 50 is equal to or less than the humidity target value, it may be said that the gas atmosphere equal to or less than the humidity target value is also established at the side of the top surface of the wafer W. Thus, the sensor 241 of the present exemplary embodiment is disposed at the position where the transfer operation of the wafer W between the substrate transfer device 17 and the substrate holding mechanism 30 is not interfered, and it may be checked whether the humidity at the side of the top surface of the wafer W becomes equal to or less than the humidity target value.

In the above-described processing unit 16, the controller 18 described above controls the movement of each of the nozzles 411 to 413 and 431 of FIG. 3 between the position above the wafer W and the position retreating from the position above the wafer W, the supply of a fluid from each of the supply sources 71 to 74 of FIG. 3, the stop of the supply, the flow rate of the fluid, and the switching of the clean air/the CDA to be supplied into the chamber 20 from the FFU 21 or the CDA supply source 221.

In addition, the processing unit 16 of the present exemplary embodiment includes a function to control a progressing of the processing performed on the wafer W, based on a measurement result of the humidity inside the chamber 20 from the hygrometer 24.

Hereinafter, the operation performed in the processing unit 16 will be described in detail with reference to FIGS. 5A to 5E, and FIGS. 6 to 8.

First, an outline of the processing performed on the wafer W will be described with reference to FIGS. 5A to 5E.

Figure 5A:
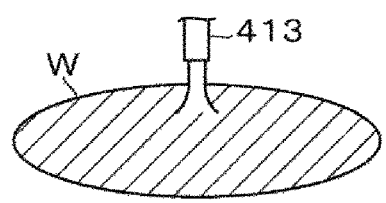
FIGS. 5A to 5E are process diagrams illustrating a flow of a processing performed in the processing unit.

When the wafer W carried into the processing unit 16 by the substrate transfer device 17 is held by a holding pin 311 provided on the holding unit 31, the first nozzle arm 41 that has retreated laterally enters the position above the wafer W such that the chemical liquid nozzle 314 and the DIW nozzle 412 are disposed at the position above the center portion of the wafer W. Then, a chemical liquid processing is performed for a preset time by supplying a chemical liquid from the chemical liquid nozzle 413 while rotating the wafer W at a predetermined rotation speed (FIG. 5A).

Figure 5B:
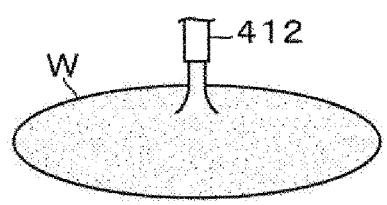
Figure 5C:
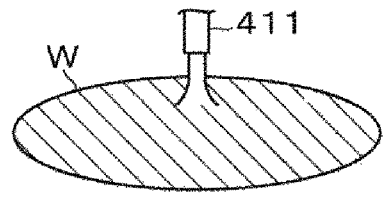

When the processing by the predetermined chemical liquid is completed, a rinsing processing is performed for a preset time by stopping the supply of the chemical liquid from the chemical liquid nozzle 413 and supplying the DIW from the DIW nozzle 412 while still rotating the wafer W that has been subjected to the chemical liquid processing (FIG. 5B). After the rinsing processing is performed for the predetermined time, a processing of replacing the DIW with IPA is performed by stopping the supply of the DIW from the DIW nozzle 412 and supplying IPA from the IPA nozzle 411 while still rotating the wafer W (FIG. 5C).

At this time, the IPA is supplied toward the center portion of the wafer W from the IPA nozzle 411. The supplied IPA spreads over the surface of the wafer W due to the action of the centrifugal force so that a liquid film of the IPA is formed on the entire surface of the wafer W. By forming the liquid film of the IPA in this way, the DIW supplied to the surface of the wafer W may be mixed and replaced with the IPA during the rinsing processing.

Here, the processing of replacing the DIW on the surface of the wafer W with the IPA includes moving the IPA between the center portion of the wafer W and the peripheral edge of the wafer W, to avoid that the mixed liquid of the DIW and the IPA or the IPA on the surface of the wafer W is removed so that the surface of the wafer W is exposed to the gas, in addition to supplying the IPA to the center portion of the wafer W.

Figure 5D:
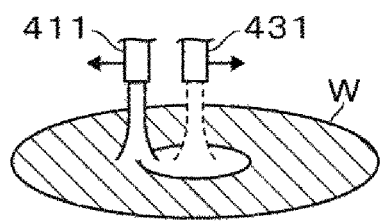

After the replacing processing is completed, a drying processing is performed by removing the IPA on the wafer W and exposing the surface of the wafer W to the gas. First, the IPA nozzle 411 is moved to a sideward position from the position for supplying the IPA to the center portion of the wafer W (e.g., a position moved radially by about several tens mm from the center portion of the wafer W) while supplying the IPA to the wafer W from the IPA nozzle in the state where the rotation of the wafer W is continued. As a result, the IPA flows outward from the center portion of the wafer W where the IPA supplied from the IPA nozzle 411 does not reach, due to the centrifugal force, so that an area where no liquid film exists (hereinafter, referred to as a "core") is formed (FIG. 5D, a first drying processing).

In accordance with the above-described movement operation of the IPA nozzle 411, the second nozzle arm 43 that has retreated laterally enters the position above the wafer W such that the N2 nozzle 431 is disposed at the position above the center portion of the wafer W. Then, when the core is formed as described above, N2 gas is supplied toward the core so as to facilitate the drying of the surface of the wafer W.

Thereafter, the nozzles 411 and 431 are moved from the side of the center portion of the wafer W to the side of the peripheral edge of the wafer W, e.g., in the mutually opposite direction, while continuously rotating the wafer W, supplying the IPA from the IPA nozzle 411, and supplying N2 gas from the N2 nozzle 431. In this scanning operation, the movement operation of each of the nozzle arms 41 and 43 is controlled such that the position to which the N2 gas from the N2 nozzle 431 is supplied is closer to the side of the center portion of the wafer W in the radial direction than the position to which the IPA from the IPA nozzle 411 is supplied.

According to the scanning operation of the supply position of the IPA, the liquid film of the IPA is swept away to the side of the peripheral edge of the wafer W so as to be removed, and as a result, the area where no liquid film is formed becomes large. In addition, according to the scanning operation of the supply position of N2 gas, N2 gas is sprayed to the surface of the wafer W on which the liquid film of the IPA has been swept away, and the drying of the area is completed (FIG. 5E, a second drying processing).

When the supply position of the IPA reaches the peripheral edge of the wafer W, the supply of the IPA from the IPA nozzle 411 is stopped. Subsequently, when the supply position of N2 gas reaches the peripheral edge of the wafer W, the supply of N2 gas from the N2 nozzle 431 is stopped. The drying processing is ended by the stopping the rotation of the wafer W.

Figure 5E:

In the processing of the wafer W illustrated in FIGS. 5A to 5E, FIGS. 5A to 5C correspond to the processing liquid supplying processes of the present exemplary embodiment, and the first and second drying processings which follow the operation of forming the core by removing a part of the liquid film of the IPA on the surface of the wafer W (the operation of stopping the supply of the drying liquid to the center portion of the wafer W) correspond to the drying processes (FIGS. 5D and 5E). The drying process is not limited to the above-described operation and includes removing the IPA. For example, the drying process includes stopping the supply of the IPA to the center portion of the wafer W and removing the IPA from the center portion of the wafer W toward the peripheral edge of the wafer W by using the centrifugal force caused from the rotation of the wafer W.

As a result of the above-described operation, the DIW is replaced with the IPA so as to be removed from the entire surface of the wafer W so that a dried wafer W may be obtained.

After the drying of the wafer W is ended, each of the nozzle arms 41 and 43 retreats laterally, and the rotation of the wafer W is stopped (an operation before carry-out). Then, the processed wafer W is taken out of the processing unit 16 by the substrate transfer device 17. In this way, the series of processings on the wafer W in the processing unit 16 are ended.

The above-described operation is performed when the controller 18 reads a program stored in the storage unit 19.

Here, in the processing unit 16 of the present exemplary embodiment, the gas to be supplied to the chamber 20 is switched between the clean gas and the CDA as a low humidity gas, according to the contents of the processings described using FIGS. 5A to 5E. In addition, when the humidity inside the chamber 20 is not equal to or less than the preset humidity target value, the drying processing process is not started.

Hereinafter, detailed descriptions will be made on the switching of the gas to be supplied to the chamber 20, and the operation of controlling the progressing of the processing performed on the wafer W based on the measurement value of the humidity inside the chamber 20 which is measured by using the hygrometer 24.

Figure 6:
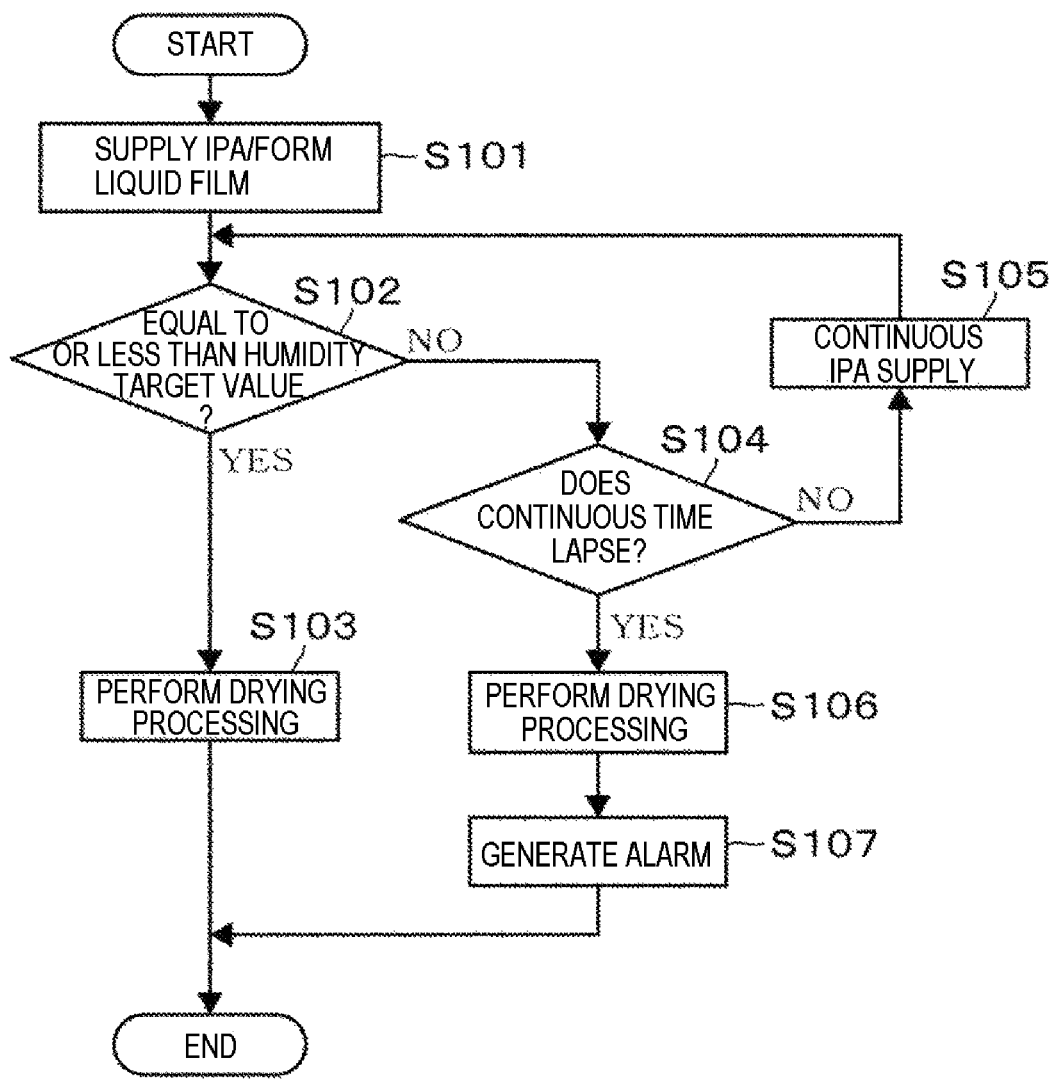
FIG. 6 is a flow chart illustrating a flow of an operation according to a drying processing of a wafer.
Figure 7:
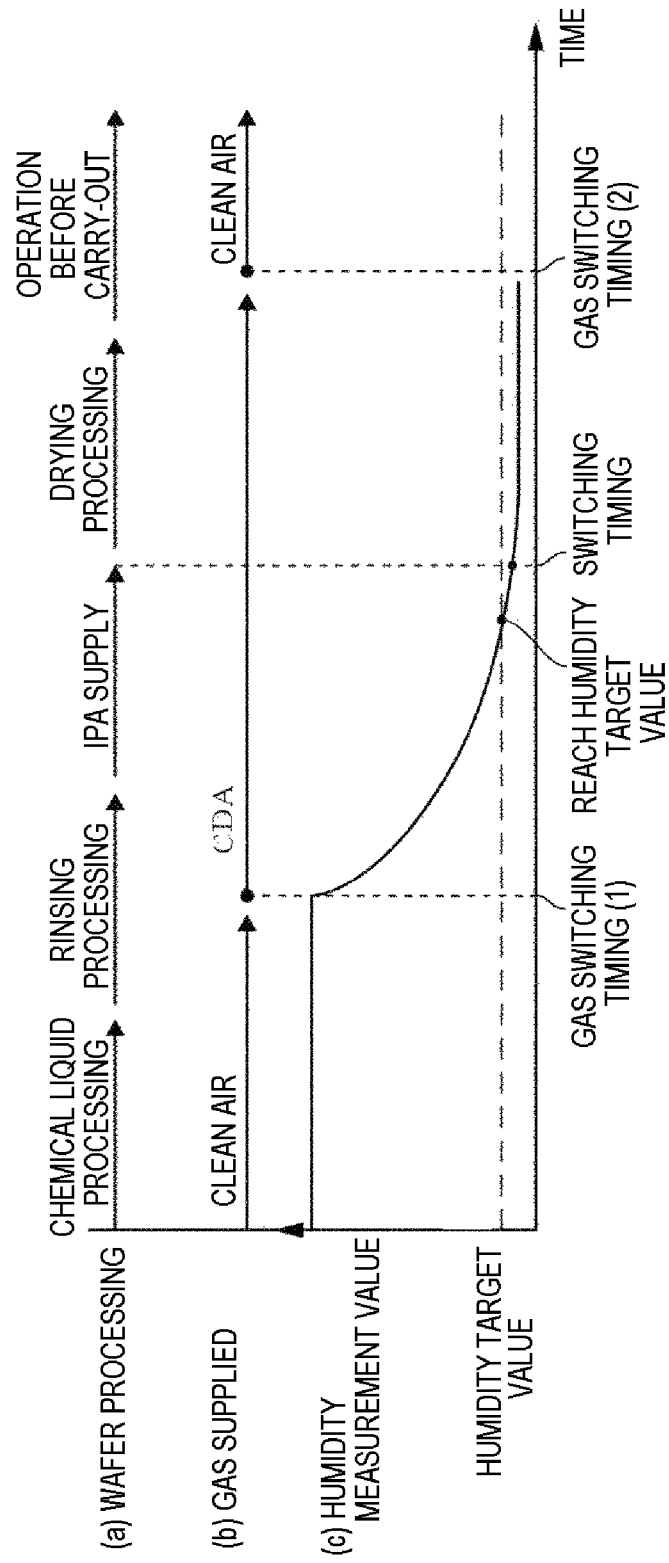
FIG. 7 is a first time chart according to the processing performed in the processing unit.
Figure 8:
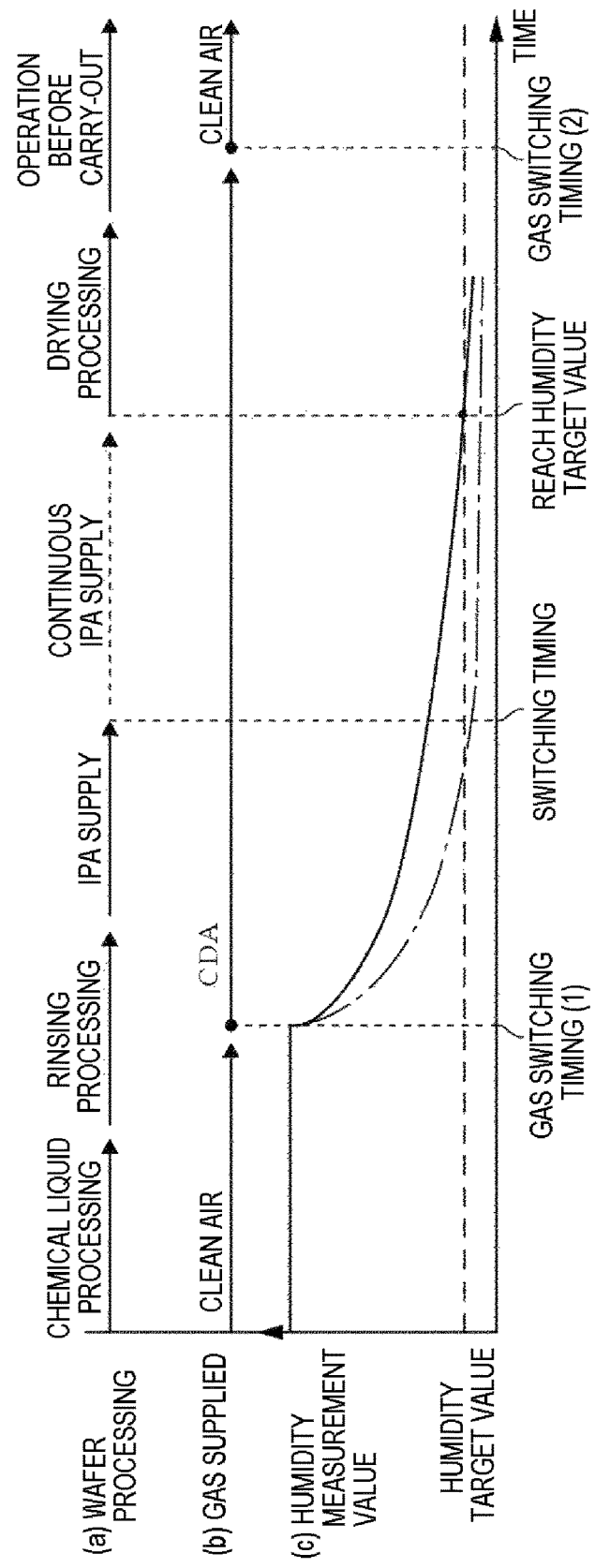
FIG. 8 is a second time chart according to the processing performed in the processing unit.

FIG. 6 is a flow chart illustrating a flow of the operation of controlling the progressing of the processing on the wafer W. In addition, FIGS. 7 and 8 are time charts during a time period for the processing of the wafer W. Of the two time charts, FIG. 7 represents a case where the inside of the chamber 20 reaches the humidity target value before a preset switching timing lapses, and FIG. 8 represents a case where the inside of the chamber 20 reaches the humidity target value after the switching timing lapses. Here, the switching timing refers to a timing (set time) for switching a programmed replacement processing to the drying processing. In the above-described example, the switching timing refers to the timing for performing the operation of switching the supply of the IPA to the center portion of the wafer W to the drying processing (however, the supply of the IPA to the outer position of the core is continued as illustrated in FIG. 5D). In addition, part (a) of FIG. 7 and part (a) of FIG. 8 represent the contents of the processing corresponding to FIGS. 5A to 5E. In addition, part (b) of FIG. 7 and part (b) of FIG. 8 represent a type of the gas supplied to the chamber 20. Further, part (c) of FIG. 7 and part (c) of FIG. 8 represent a change of the measurement value of the humidity inside the chamber 20 with time lapse.

According to the time chart of parts (a) and (b) of FIG. 7, the clean air is supplied into the chamber 20 from the FFU 21 during the time period for the chemical liquid processing (FIG. 5A). Subsequently, after the processing of the wafer W is switched to the rinsing processing (FIG. 5B), the gas switching operation is performed. However, the clean air is continuously supplied into the chamber 20 until a preset gas switching timing 1. Subsequently, when the gas switching timing 1 is reached, the gas switching operation of switching the gas supplied into the chamber 20 to the CDA is performed to supply the CDA into the chamber 20, during the time period for the rinsing processing (a low humidity gas supplying process). As a result of the switching of the gas, the humidity measurement value by the hygrometer 24 gradually decreases (part (c) of FIG. 7).

Here, the gas switching timing 1 is not limited to the timing set during the time period for the rinsing processing as in the example illustrated in part (c) of FIG. 7. For example, time from the start of the supply of the CDA until the humidity inside the chamber 20 becomes equal to or less than the humidity target value (estimated time obtained by estimating when the humidity becomes equal to or less than the humidity target value) is calculated through, for example, pretesting, and the gas switching timing 1 may be determined based on the estimated time. As a specific example, the gas switching timing 1 may be set by counting the estimated time backward from the switching timing. That is, the gas switching timing 1 is set such that the humidity becomes equal to or less than the humidity target value before the switching timing. Accordingly, the gas switching operation may be started after the start of the supply of the IPA, as long as the humidity becomes equal to or less than the humidity target value until the start of the drying processing from the start of the gas switching operation. In addition, while the gas switching operation may be performed at a timing earlier than the above-described example, the consumption of the CDA may increase. Further, although it may be taken into account to further expedite the start of the gas switching operation and start the gas switching operation during the chemical liquid processing, this is not favorable because, when the chemical liquid is, for example, an etching liquid, the in-plane uniformity of the etching may be deteriorated.

When the rinsing processing is performed for the preset time, the processing liquid supplied to the wafer W is switched to the IPA so as to form the liquid film of the IPA on the surface of the wafer W (the IPA supply in FIG. 5C and part (a) of FIG. 7). Here, the "IPA supply" in each drawing means a supply of the IPA for forming an IPA liquid film on the surface of the wafer W.

The follow-up operation will be described with reference to the flow chart of FIG. 6 (Start in FIG. 6). The IPA supply is started so as to form the liquid film of the IPA on the surface of the wafer W (step S101 in FIG. 6).

Then, when the switching timing for performing the operation of switching to the drying processing is reached, it is determined whether the humidity measurement value obtained by measuring the humidity inside the chamber 20 by using the hygrometer 24 becomes equal to or less than the preset humidity target value (e.g., 1 mass %) (step S102).

As illustrated in part (c) of FIG. 7, when it is determined that the measurement value of the humidity inside the chamber 20 reaches the humidity target value before the switching timing (step S102 of FIG. 6: Yes), the IPA nozzle 411 is moved to start the drying processing of forming the core as described above (step S103). Then, after the drying processing is performed by the method described above with reference to FIGS. 5D and 5E, the operation of carrying the processed wafer W outward is performed (End in FIG. 6).

In addition, the gas supplied to the chamber 20 is switched to the clean air from the FFU 21, for example, at a predetermined gas switching timing 2 after the drying processing of the wafer W is completed (part (a) of FIG. 7).

Meanwhile, as illustrated by the solid line in part (c) of FIG. 8, when it is determined that the measurement value of the humidity inside the chamber 20 does not reach the humidity target value even though the switching timing lapses (step S102 of FIG. 6: No; step S104 of FIG. 6: No), a continuous IPA supply that continuously supplies the IPA to the center portion of the wafer W is performed (step S105). According to this operation, the state where the liquid film of the IPA is formed on the surface of the wafer W is maintained until the measurement value of the humidity inside the chamber 20 reaches the humidity target value.

Additionally, in part (c) of FIG. 8, the change of the humidity measurement value with the time lapse in part (c) of FIG. 7 is represented in an alternate long and short dash line.

When it is determined that the measurement value of the humidity inside the chamber 20 reaches the humidity target value (step S102 of FIG. 6: Yes), the drying processing is started according to the same sequence as that in FIG. 7, and the operation following the drying processing is performed (step S103 of FIG. 6→End, and FIG. 8).

When it is determined that the measurement value of the humidity inside the chamber 20 does not reach the humidity target value even though a preset continuous time lapses after the start of the continuous IPA supply (step S102 of FIG. 6: No→step S104 of FIG. 6: Yes), the continuous IPA supply is stopped, and the drying processing is performed under the atmosphere where the humidity inside the chamber 20 is higher than the humidity target value (step S106). The time for the continuous IPA supply is set to, for example, about 1 minute to about several minutes from the start of the continuous IPA supply.

Here, on the wafer W subjected to the drying processing in the state where the humidity measurement value does not reach the humidity target value, a watermark formation or a pattern collapse may occur due to the dew condensation on the surface of the wafer W.

Thus, an alarm is generated to the processing unit 16, to the effect that the humidity inside the chamber 20 does not reach the humidity target value within a predetermined time (the time until the time for the continuous IPA supply lapses, in the present exemplary embodiment) (step S107). As the alarm, an alarm sound may be generated from a speaker (not illustrated) provided in the substrate processing system 1, or an alarm screen may be displayed on an operation screen (not illustrated) of the substrate processing system 1. In addition, the wafer W subjected to the drying processing in the state where the humidity measurement value does not reach the humidity target value is labelled with information to this effect, and the wafer W is isolated from product wafers W to be accommodated in the carrier C, or an additional inspection to check the situation of the occurrence of the watermark or the pattern collapse is performed.

According to the above-described processing unit 16 of the present exemplary embodiment, the following effects are achieved. The drying processing of the wafer W is started after the humidity measurement value obtained by measuring the humidity of the chamber 20 in which the liquid processing is performed becomes equal to or less than the preset humidity target value. As a result, the influence (the watermark formation or the pattern collapse) on the wafer W which is caused when the drying of the wafer W is performed in the state of the insufficient replacement with the CDA inside the chamber 20 may be reduced.

The method of controlling the timing for performing the drying processing based on the measurement result of the humidity inside the chamber 20 which is measured by using the hygrometer 24 is not limited to the example described above with reference to FIGS. 6 to 8.

Figure 9:
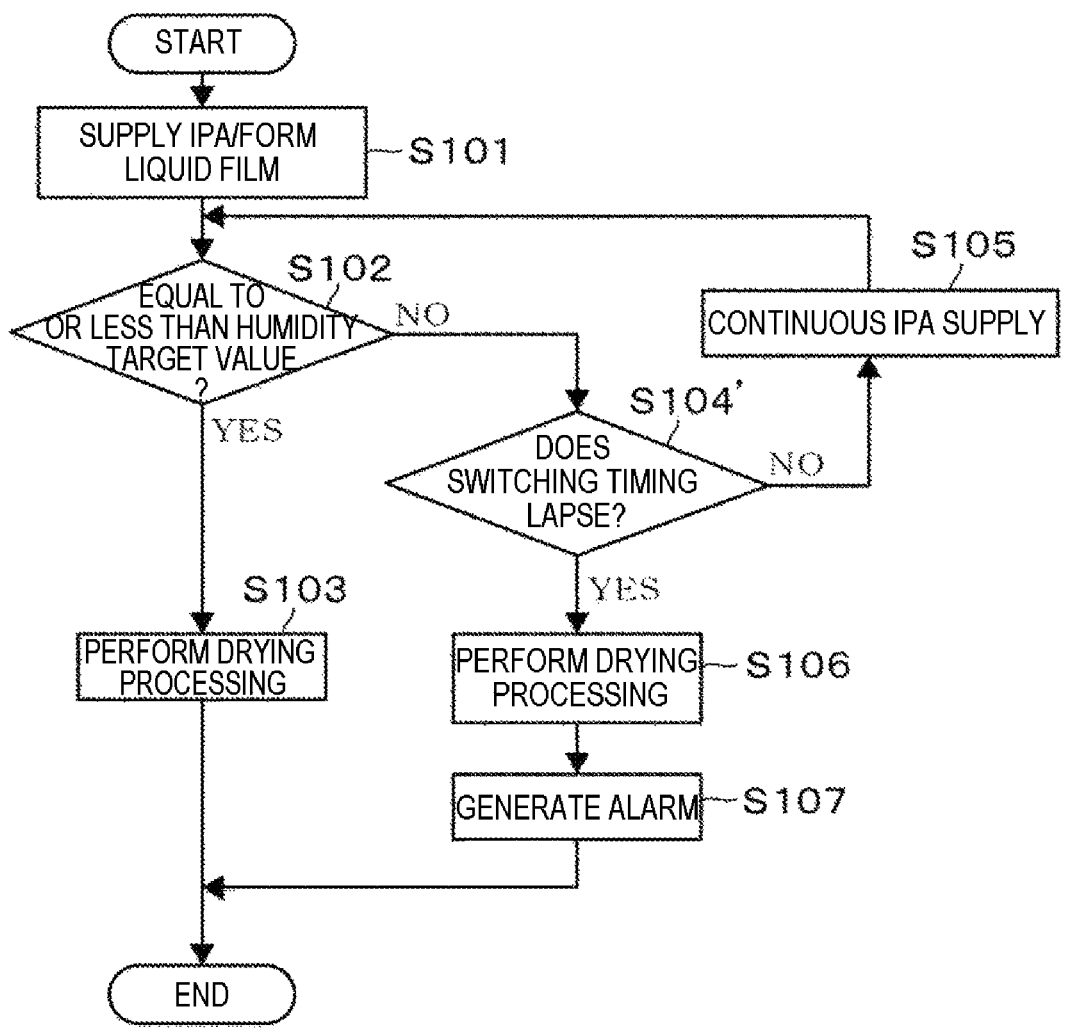
FIG. 9 is a flow chart of a drying processing of a wafer according to a second exemplary embodiment.

For example, as illustrated in FIG. 9, when the humidity inside the chamber 20 becomes equal to or less than the humidity target value, the timing for starting the drying processing may be expedited without waiting to reach the switching timing (step S101→step S102: Yes→step S103 in FIG. 9, and FIG. 10).

Figure 10:
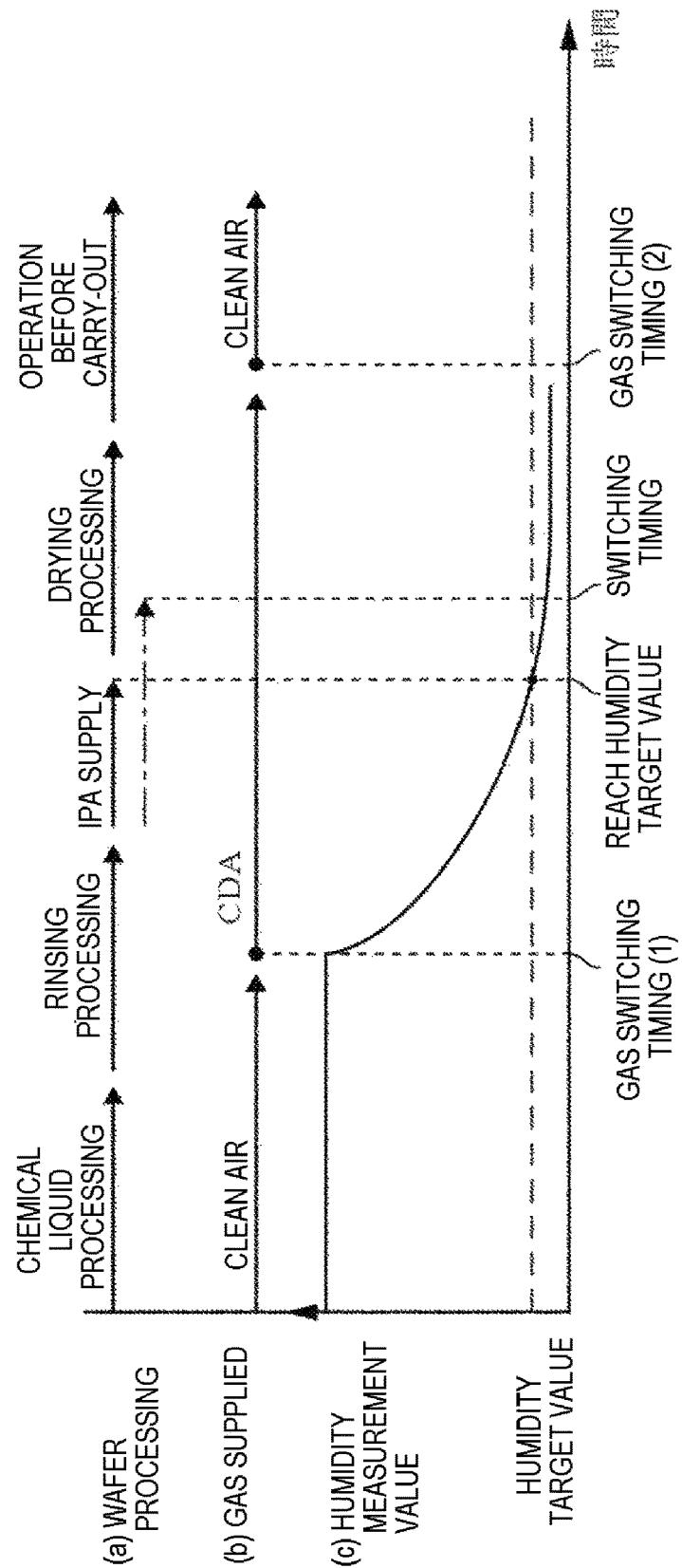
FIG. 10 is a time chart of the processing according to the second exemplary embodiment.

In FIG. 10, the alternate long and short dash line represents a case where the IPA is supplied to the center portion of the wafer W until the preset switching timing.

Here, since above-described FIG. 6 describes the example where the timing for starting the drying processing is deferred, FIG. 9 only illustrates the example where the timing for starting the drying timing is expedited. Accordingly, in the present exemplary embodiment, the setting of the continuous time is omitted, and the drying processing is started when the switching timing lapses, regardless of whether the humidity inside the chamber 20 reaches the target value (step S104': Yes→step S106 in FIG. 9). Thereafter, an alarm may be generated as in the processing after the continuous time in FIG. 6 (step S107).

In addition, even when the switching timing for switching the IPA supply to the drying process is not preset, the influence (the watermark formation or the pattern collapse) on the wafer W which is caused when the drying of the wafer W is performed in the state of the insufficient replacement with the CDA inside the chamber 20 may be reduced.

For example, without programming the switching timing for switching the supply of the IPA to the center portion of the wafer W to the drying processing, the supply of the IPA to the center portion of the wafer W may be switched to the drying processing, only based on the determination criteria of "whether the humidity inside the chamber 20 becomes equal to or less than the humidity target value."

In addition, the hygrometer 24 provided in the processing unit 16 may be used for a purpose other than the determination of the timing for starting the drying process (FIGS. 5D and 5E) after the processing liquid supplying process using the processing liquid (FIGS. 5A to 5C).

For example, a confirming operation may be performed during the standby time when the wafer W is not processed in the processing unit 16, to switch the gas supplied to the chamber 20 from the clean air to the CDA and confirm whether the humidity measurement value by the hygrometer 24 becomes equal to or less than the humidity target value as estimated (e.g., until the lapse of the time corresponding to the switching timing). In addition, in order to make the state inside the chamber 20 identical to that during the time for the processing of the wafer W, the substrate holding mechanism 30 may be rotated in a state of not holding the wafer W, or the processings illustrated in FIGS. 5A to 5E may be performed by using a dummy wafer W.

In the above-described confirming operation, when the change of the humidity target value with the time lapse is different from an ordinary change, for example, a facility trouble may be checked in advance in the CDA supply system as the low humidity gas supply unit (the CDA supply line 222 or the CDA supply source 221, or the gas supply line 211 or the gas diffusion portion 213 at the downstream side of the switching valve 215 during the time period for receiving the CDA) or the exhaust system of the chamber 20 (the exhaust port 52, the chamber exhaust port 201, or the exhaust unit 23).

In addition, the sensor 241 may be provided at a position separate from the position outside the recovery cup 50. For example, the sensor 241 of the hygrometer 24 may be configured to be movable between the position above the wafer W held on the substrate holding mechanism 30 and the position retreating from the position above the wafer W. In this case, for example, when the wafer W is transferred to the substrate holding mechanism 30, the sensor 241 retreats to the retreating position. When the start of the drying process is determined, the sensor 241 may be moved to the position above the wafer W to check whether the atmosphere near the surface of the wafer W is equal to or less than the humidity target value, and then, the drying process may be started.

Subsequently, a heating mechanism that supplies a heating gas to the rear surface of the wafer W will be described with reference to FIG. 11. For example, in the drying processing using a volatile drying liquid (e.g., the IPA), the vaporization heat may be lost by the drying liquid, thereby lowering the temperature of the wafer W and causing the dew condensation. Thus, in a conventional processing unit 16, the wafer W is held while forming a gap from the holding unit 31 by using the plurality of holding pins 311 provided at the peripheral edge of the holding unit 31 as illustrated in FIG. 3, 4 or 11, and DIW heated to, for example, about 60° C. to about 80° C. is supplied toward the gap so as to suppress the temperature of the wafer W from being lowered.

However, when the DIW is used for heating the wafer W during the drying processing, a mixed liquid of the IPA and the DIW which is discharged from the wafer W is required to be drained, thereby increasing the load of a liquid draining processing.

Figure 11:
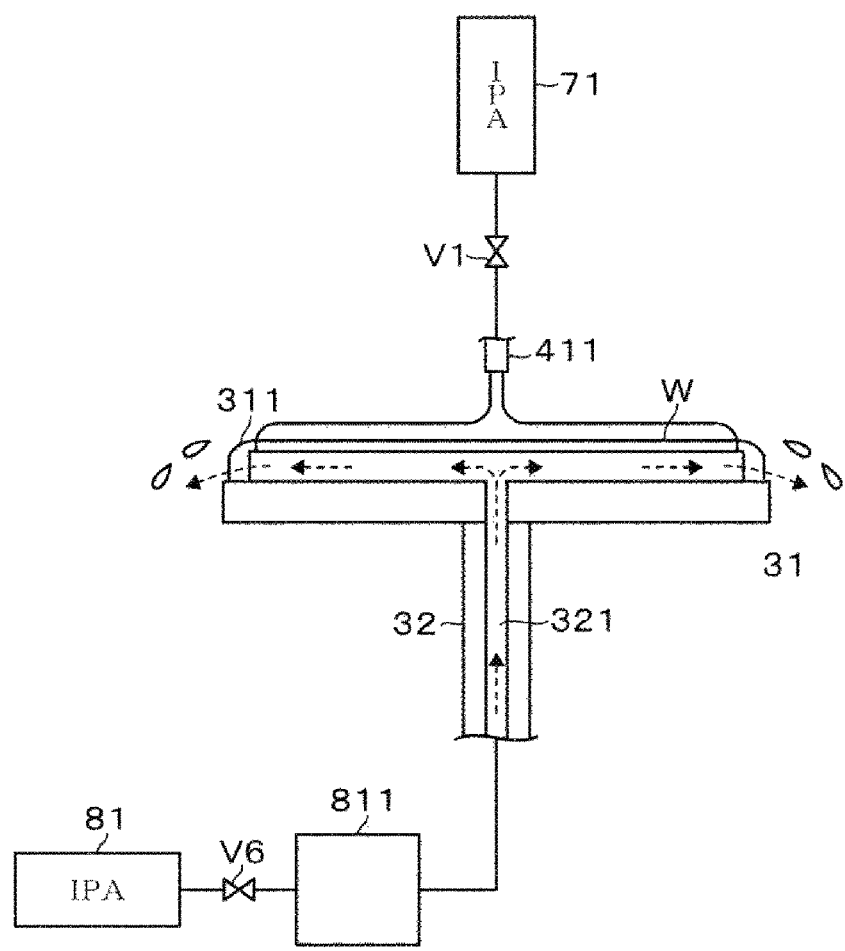
FIG. 11 is a view for explaining an exemplary configuration of a heating mechanism for a wafer.

Thus, in the example illustrated in FIG. 11, the heating of the wafer W is performed by using the same substance as the drying liquid supplied to the side of the top surface of the wafer W, i.e., the heating steam of the IPA in the present exemplary embodiment. That is, a heating gas flow path 321 is formed in the support unit 32 and connected to the IPA supply source 81 via a vaporization unit 811 and an opening/closing valve V6. The IPA supply source 81 may be common with the IPA supply source 71 connected to the IPA nozzle 411, or may be configured as a separate member. The vaporization unit 811 includes a heating unit (not illustrated) for obtaining the IPA steam heated to, for example, 100° C., and a heating space (not illustrated) where the IPA supplied in a liquid state, heated to become a gas, and then, increased to the temperature of 100° C. flows. The heating gas flow path 321, the vaporization unit 811, the opening/closing valve V6, and the heating IPA supply source 81 constitute a heating gas supply unit.

According to the above-described configuration, the IPA steam as the heating gas is supplied to the side of the bottom surface of the wafer W to which N2 gas is sprayed after the supply position of the IPA is moved, and the IPA is removed, so that the temperature of the area of the wafer W from which the IPA is removed may be heated to be higher than the dew point temperature of water. Especially, since the IPA steam may heat the wafer W to a temperature higher than about 82° C. which is the boiling point of the IPA, the effect on heating the wafer W is high. In addition, even when the IPA steam is cooled and liquefied when being in contact with, for example, the wafer W, the cooled and liquefied IPA is collected through the recovery cup 50 together with the liquid IPA discharged from the side of the top surface of the wafer W so that the IPA may be used as IPA having a relatively high purity. Further, an effect on suppressing an increase of the humidity inside the chamber 20 may also be obtained, compared with the case where the wafer W is heated by using the heating DIW.

In another example, performing the drying processing of the wafer W by using the drying liquid in the processing unit 16 may not be necessarily required. For example, in a case of a wafer W that has been subjected to a hydrophobic treatment using a dilute hydrofluoric acid or a silylating agent, the drying processing may be performed by stopping the supply of the rinsing liquid after the rinsing processing, without performing the replacement with the drying liquid. In this drying processing as well, the drying processing is performed after checking that the humidity inside the chamber 20 becomes equal to or less than a predetermined humidity target value, by supplying the low humidity gas (e.g., the CDA) into the chamber 20, so that the effect on suppressing the occurrence of the dew condensation on the surface of the wafer W is obtained. In this case, the switching timing is the timing when the supply of the rinsing liquid to the center portion of the wafer W is stopped, and the rinsing liquid is removed from the center portion of the wafer W toward the peripheral edge of the wafer W.

In addition, the gas useful as the low humidity gas may be an inert gas such as, for example, nitrogen gas, instead of the above-described CDA. Meanwhile, the liquid useful as the drying liquid is not also limited to the IPA, and, for example, acetone or hydrofluoroether (HFE) may be adopted.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing method for performing a liquid processing on a substrate disposed inside a processing container, and then, drying the substrate, the method comprising:
   a processing liquid supplying step of performing a liquid processing by supplying a processing liquid to a center portion of the substrate inside the processing container;
   a low humidity gas supplying step of supplying a low humidity gas for lowering a humidity inside the processing container, into the processing container during a time period when the processing liquid is supplied to the substrate; and
   a drying step of removing the processing liquid on the substrate and drying the substrate,
   wherein the drying step is started after a humidity measurement value obtained by measuring the humidity inside the processing container becomes equal to or less than a preset humidity target value.

2. The liquid processing method of claim 1, wherein the drying step is started by stopping the supply of the processing liquid to the center portion of the substrate.

3. The liquid processing method of claim 1, wherein a switching timing of the processing liquid supplying step and the drying step is preset, and the processing liquid supplying step is switched to the drying step when the humidity measurement value becomes equal to or less than the preset humidity target value at the switching timing.

4. The liquid processing method of claim 1, wherein a switching timing of the processing liquid supplying step and the drying step is preset, the processing liquid supplying step is not switched to the drying step when the humidity measurement value does not become equal to or less than the preset humidity target value at the switching timing, and the processing liquid supplying step is continued.

5. The liquid processing method of claim 4, wherein when the humidity measurement value becomes equal to or less than the preset humidity target value after the processing liquid supplying step is continued, the processing liquid supplying step is switched to the drying step.

6. The liquid processing method of claim 4, wherein when the humidity measurement value does not become equal to or less than the preset humidity target value after a preset time lapses from the time when the processing liquid supplying step is continued, the processing liquid supplying step is switched to the drying step, and an alarm is generated to a device performing the liquid processing.

7. The liquid processing method of claim 1, wherein when the humidity measurement value becomes equal to or less than the preset humidity target value during the processing liquid supplying step, the processing liquid supplying step is switched to the drying step.

8. The liquid processing method of claim 1, wherein a switching timing of the processing liquid supplying step and the drying step is preset, and the processing liquid supplying step is switched to the drying step when the humidity measurement value becomes equal to or less than the preset humidity target value during the processing liquid supplying step which precedes the switching timing.

9. The liquid processing method of claim 3, wherein a timing for starting a supply of the low humidity gas in the low humidity gas supplying step is set by determining, in advance, an estimated time from the start of the supply of the low humidity gas to the processing container until a target value reaching timing obtained by estimating when the humidity measurement value becomes equal to or less than the humidity target value, and counting the estimated time backward from the target value reaching timing, and the target value reaching timing is set to precede the switching timing.

10. The liquid processing method of claim 4, wherein a timing for starting a supply of the low humidity gas in the low humidity gas supplying step is set by determining, in advance, an estimated time from the start of the supply of the low humidity gas to the processing container until a target value reaching timing obtained by estimating when the humidity measurement value becomes equal to or less than the humidity target value, and counting the estimated time backward from the target value reaching timing, and the target value reaching timing is set to precede the switching timing.

11. The liquid processing method of claim 1, wherein the supply of the processing liquid is performed on the substrate held horizontally and rotating around a vertical axis, and a measurement of the humidity inside the processing container is performed at a position radially outside the rotating substrate.

12. A non-transitory computer readable storage medium that stores a computer executable program for use in a substrate processing apparatus of performing a liquid processing on a substrate, wherein the computer executable program includes a step group organized to, when executed, causes a computer to execute the liquid processing method of claim 1.

* * * * *